United States Patent
Du et al.

(10) Patent No.: US 11,047,918 B2
(45) Date of Patent: Jun. 29, 2021

(54) METHOD FOR CORRECTING SOH, APPARATUS, BATTERY MANAGEMENT SYSTEM AND STORAGE MEDIUM

(71) Applicant: Contemporary Amperex Technology Co., Limited, Ningde (CN)

(72) Inventors: Mingshu Du, Ningde (CN); Shichao Li, Ningde (CN); Jian Ruan, Ningde (CN); Shenzhi Tang, Ningde (CN); Yanhua Lu, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/135,179

(22) Filed: Dec. 28, 2020

(65) Prior Publication Data
US 2021/0116513 A1   Apr. 22, 2021

Related U.S. Application Data

(63) Continuation of application No. PCT/CN2020/086187, filed on Apr. 22, 2020.

(30) Foreign Application Priority Data

May 17, 2019 (CN) .......................... 201910413430.9

(51) Int. Cl.
*G01R 31/00*   (2006.01)
*G01R 31/392*  (2019.01)
(Continued)

(52) U.S. Cl.
CPC ....... *G01R 31/392* (2019.01); *G01R 31/3842* (2019.01); *H01M 10/4257* (2013.01);
(Continued)

(58) Field of Classification Search
USPC .......................... 324/426, 430–434; 429/90
See application file for complete search history.

(56) References Cited

U.S. PATENT DOCUMENTS

| 2015/0066406 | A1 | 3/2015 | Sun et al. | |
| 2017/0038436 | A1* | 2/2017 | Montaru | G01R 31/367 |
| 2017/0368913 | A1* | 12/2017 | Kumar | B60H 1/00378 |

FOREIGN PATENT DOCUMENTS

| CN | 102445663 A | 5/2012 |
| CN | 103698714 A | 4/2014 |

(Continued)

OTHER PUBLICATIONS

PCT International Search Report and Written Opinon for PCT/CN2020/086187 dated Jul. 28, 2020, 14 pages.
(Continued)

*Primary Examiner* — Vincent Q Nguyen
(74) *Attorney, Agent, or Firm* — Pearne & Gordon LLP (57) ABSTRACT

A method for correcting a SOH, an apparatus, a battery management system and a storage medium are provided. The method includes obtaining a relationship curve between a ratio of an accumulated charge/discharge capacity variation and a corresponding voltage-parameter variation of a battery cell and a voltage parameter itself; determining a valid peak point on the relationship curve; determining a SOH calibration value corresponding to voltage parameter datum at the valid peak point; correcting a current SOH according to the SOH calibration value. The estimation accuracy of the SOH can be improved according to this method.

14 Claims, 9 Drawing Sheets

(51) Int. Cl.
    *G01R 31/3842*    (2019.01)
    *H01M 10/42*     (2006.01)
    *H02J 7/00*      (2006.01)

(52) U.S. Cl.
    CPC ............. *H02J 7/007186* (2020.01); *H01M 2010/4271* (2013.01); *H01M 2010/4278* (2013.01)

(56) References Cited

FOREIGN PATENT DOCUMENTS

| | | |
|---|---|---|
| CN | 104051799 A | 9/2014 |
| CN | 105510832 A | 4/2016 |
| CN | 105548912 A | 5/2016 |
| CN | 106446520 A | 2/2017 |
| CN | 108445406 A | 8/2018 |
| CN | 108470944 A | 8/2018 |
| CN | 109061514 A | 12/2018 |
| CN | 110967631 A | 4/2020 |

OTHER PUBLICATIONS

The First Office Action dated Aug. 6, 2020 for Chinese Application No. 201910413430.9, 9 pages.
The Second Office Action dated Dec. 10, 2020 for Chinese Application No. 201910413430.9, 7 pages.

* cited by examiner

METHOD FOR CORRECTING SOH, APPARATUS, BATTERY MANAGEMENT SYSTEM AND STORAGE MEDIUM

CROSS-REFERENCE TO RELATED APPLICATIONS

This application is a continuation of International Application No. PCT/CN2020/086187, filed on Apr. 22, 2020, which claims priority to Chinese Patent Application No. 201910413430.9, filed on May 17, 2019, both of which are hereby incorporated by reference in their entireties.

TECHNICAL FIELD

This application relates to the field of battery technology, and in particular, to a method for correcting a SOH, an apparatus, a battery management system and a storage medium.

BACKGROUND

Aging or deterioration of a battery is inevitable in long-term use, which results in significant reduction of battery capacity. Therefore, it is necessary to estimate a SOH (State of Health) of the battery.

A method for detecting a battery SOH in the prior art includes: obtaining an open-circuit voltage (OCV) of a battery cell when the vehicle is in a static or low-current state; obtaining a state of charge (SOC) according to a pre-calibrated OCV-SOC relationship curve in a table-looking up manner; estimating an actual capacity of the battery cell according to an accumulated charge/discharge capacity during the calculation of the SOC; and then estimating the SOH.

However, as the OCV-SOC relationship curve changes with the aging of the battery, a calculation error of the state of charge (SOC) will increase, and the estimated SOH is not reliable. In this case, if the charging current for use is still the same, the actual rate of charging will be too large, and problems such as over-current risk will occur.

SUMMARY

The purpose of this application is to provide a method for correcting a SOH, an apparatus, a battery management system and a storage medium, which can solve the problem of inaccurate SOH estimation caused by deviation of the OCV-SOC relationship curve after the battery is aged, and improve the estimation accuracy of the SOH.

In a first aspect, an embodiment of the present application provides a method for correcting a SOH, where the method includes:

obtaining a relationship curve between a ratio of an accumulated charge/discharge capacity variation to a corresponding voltage-parameter variation of a battery cell and a voltage parameter itself;

determining a valid peak point on the relationship curve;

determining a SOH calibration value corresponding to a voltage parameter datum at the valid peak point based on a pre-calibrated corresponding relationship between peak voltage parameter data and SOH calibration values;

correcting a current SOH according to the SOH calibration value.

In a second aspect, an embodiment of the present application provides an apparatus for correcting a SOH, where the apparatus includes:

a relationship curve obtaining module configured to obtain a relationship curve between a ratio of an accumulated charge/discharge capacity variation to a corresponding voltage-parameter variation of a battery cell with a voltage parameter itself;

a valid peak point determining module configured to determine a valid peak point on the relationship curve;

a SOH calibration value determining module configured to determine a SOH calibration value corresponding to a voltage parameter datum at the valid peak point based on a pre-calibrated corresponding relationship between peak voltage parameter data and SOH calibration values;

a SOH correcting module configured to correct a current SOH according to the SOH calibration value.

In a third aspect, an embodiment of the present application provides a battery management system, which includes the apparatus for correcting the SOH as described above.

In a fourth aspect, an embodiment of the present application provides a computer-readable storage medium having a program stored thereon, where the program, when executed by a processor, implements the method for correcting the SOH as described above.

As described above, according to the embodiments of the present application, for the phenomenon that the OCV relationship curve changes significantly after the battery cells in some systems are aged, the change rule of the OCV relationship curve is quantified to generate the pre-calibrated corresponding relationship between peak voltage parameter data and SOH calibration values. Therefore, when the SOH needs to be corrected with the problem of inaccurate SOH estimation caused by the deviation of the OCV-SOC relationship curve after the battery cell is aged, the current SOH can be corrected by obtaining the relationship curvep between the ratio of an accumulated charge/discharge capacity variation to a corresponding voltage-parameter variation of a battery cell and a voltage parameter itself, determining the valid peak point on the relationship curve, and correcting the current SOH according to the SOH calibration value. Thus, the accuracy of the estimation of the SOH can be improved.

BRIEF DESCRIPTION OF THE DRAWINGS

Features, advantages, and technical effects of exemplary embodiments of the present application will be described below with reference to the drawings, and the drawings are not to scale.

DETAILED DESCRIPTION

Features and exemplary embodiments of various aspects of the present application will be described in detail below. In the following detailed description, many specific details are proposed in order to provide a comprehensive understanding of the present application.

The embodiments of the present application provide a method for correcting a SOH, an apparatus, a battery management system and a storage medium. According to the embodiments of the present application, for the phenomenon that an OCV relationship curve changes significantly after the battery cells in some systems are aged, the change rule of the OCV relationship curve is quantified for estimating the SOH after the battery is aged, which can improve the accuracy of the estimation of the SOH and solve the problem of inaccurate SOH estimation caused by the deviation of the OCV-SOC relationship curve after the battery is aged.

Figure 1:
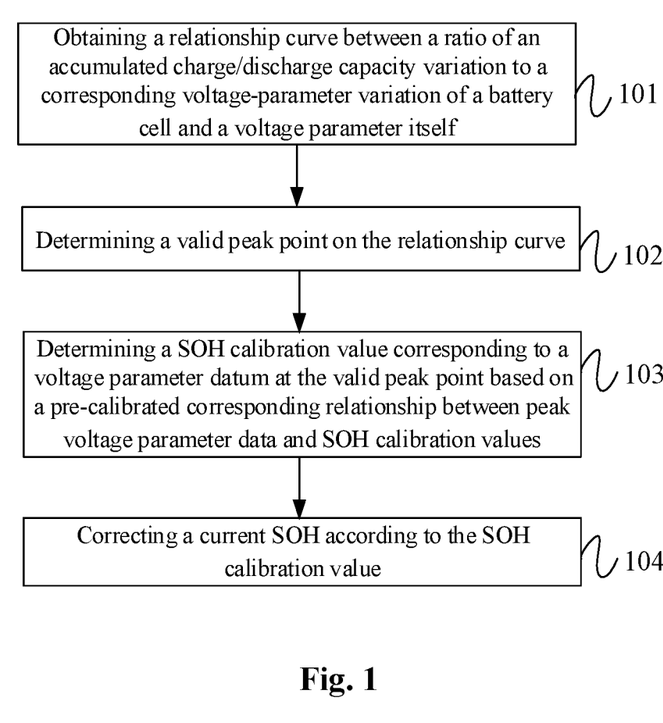
FIG. 1 is a schematic flowchart of a method for correcting a SOH according to a first embodiment of the present application.

FIG. 1 is a schematic flowchart of a method for correcting a SOH according to a first embodiment of the present application, as shown in FIG. 1, the method for correcting the SOH includes steps 101 to 104.

At step 101, a relationship curve between a ratio of an accumulated charge/discharge capacity variation to a corresponding voltage-parameter variation of a battery cell and a voltage parameter itself is obtained.

The voltage parameter includes an open circuit voltage (OCV) of the battery cell or a detected voltage when the cell is charged or discharged. The accumulated charge/discharge capacity variation indicates the variation in battery power. When only charging of the battery cell is involved, the accumulated charge/discharge capacity variation=an accumulated charge capacity variation. When only discharging of the battery cell is involved, the amount of change in the accumulated charge and discharge capacity=an accumulated discharge capacity variation. When both discharging and recharging are involved in an actual driving process, the amount of change in the accumulated charge and discharge capacity=an actual variation in battery power=an accumulated discharge capacity increment−an accumulated charge capacity increment.

When a charging current of the battery cell is greater than or equal to a sixth threshold, the voltage parameter may be an open circuit voltage (OCV) of the battery cell. The detected voltage of the battery cell may be taken as the OCV; or the detected voltage of the battery cell may be inputted into a preset battery model, and the OCV may be estimated by the battery model. The sixth threshold indicates a reference value of a slow charging rate. In contrast to a current in a charging process by inserting a charging gun into a vehicle, a charging current of a household appliance belongs to the category of slow charging rates.

When the charging current of the battery cell is lower than the sixth threshold, the voltage parameter may be the detected voltage of the battery cell Volt. Since the battery tends to be stable in a slow charging state, when the battery is in the slow charging state, the detected voltage of the battery cell may be directly used for performing the method for correcting the SOH according to the embodiments of the present application.

Figure 2:
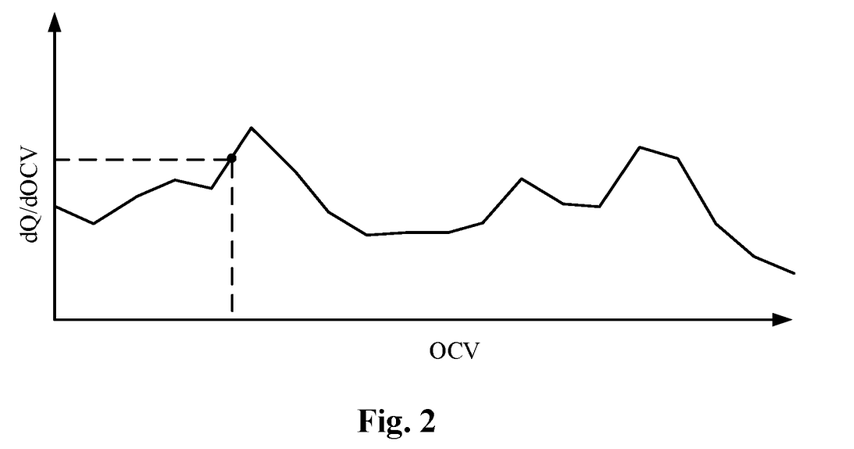
FIG. 2 is a schematic diagram of a dQ/dOCV-OCV relationship curve according to an embodiment of the present application.

FIG. 2 is a schematic diagram of a dQ/dOCV-OCV relationship curve according to an embodiment of the present application. The dQ/dOCV-OCV relationship curve may be determined based on a collected sequence of voltage parameters and a collected sequence of accumulated charge/discharge capacities.

Referring to FIG. 2, for any point on the dQ/dOCV-OCV relationship curve, a dOCV indicated by that point is a difference between an OCV indicated by that point and an OCV indicated by its previous point after a sequence of voltage parameters OCVi is sorted; a dQ indicated by that point is a difference between an accumulated charge/discharge capacity corresponding to the OCV indicated by that point and an accumulated charge/discharge capacity corresponding to the OCV indicated by its previous point.

Alternately, for any point on the dQ/dOCV-OCV relationship curve, the X-coordinate of that point may also be interpreted as an average value of two adjacent OCVs after the sequence of voltage parameters OCVi is sorted; the Y-coordinate of that point may be interpreted as a difference between accumulated charge/discharge capacities corresponding to the two adjacent OCVs. Those skilled in the art may determine the dQ/dOCV-OCV relationship curve as needed, which will not be limited here.

In an example, in order to improve the accuracy of the calculation for the correction of the SOH, the number of voltage parameter data in the sequence of voltage parameters OCVi involved in the calculation should be greater than the first threshold, so as to ensure that the data quantity is sufficient; and an absolute value of the difference between values of two adjacent voltage parameter data in the sequence of voltage parameters OCVi should be less than a second threshold, so as to avoid the problem of jumps on the curve or causing the peak information of the calculated dQ/dOCV-OCV to be hidden.

At step 102, a valid peak point on the relationship curve is determined.

At step 103, a SOH calibration value corresponding to a voltage parameter datum at the valid peak point is determined based on a pre-calibrated corresponding relationship between peak voltage parameter data and SOH calibration values.

At step 104, a current SOH is corrected according to the SOH calibration value.

Figure 3:
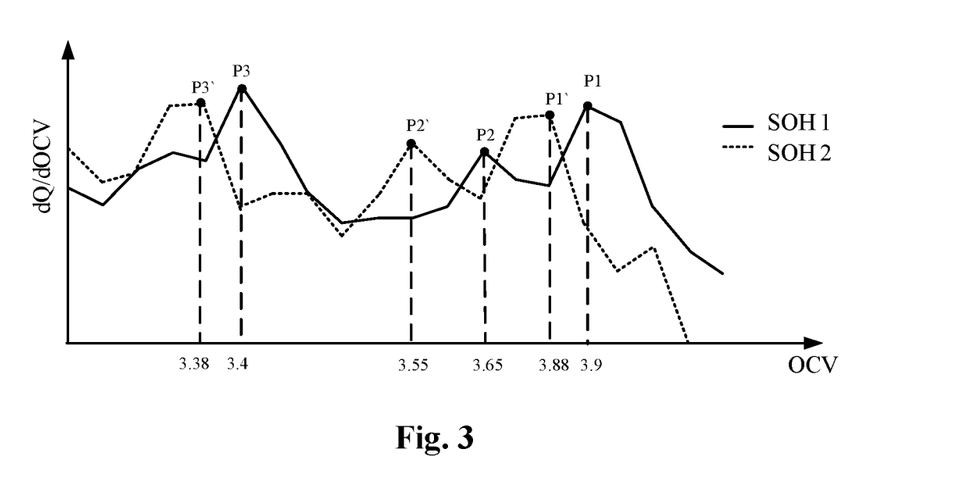
FIG. 3 is a schematic diagram of dQ/dOCV-OCV curves varying due to aging degrees of a battery cell according to an embodiment of the present application.

FIG. 3 is a schematic diagram of dQ/dOCV-OCV curves varying due to different aging degrees of a battery cell according to an embodiment of the present application.

FIG. 3 illustrates a dQ/dOCV-OCV curve corresponding to an aging degree of SOH1, and a dQ/dOCV-OCV curve corresponding to an aging degree of SOH2, where SOH1>SOH2.

It can be seen from FIG. 3 that each of the curves involves multiple peak points, and those skilled in the art may select, as needed, data of some peak points of the multiple peak points to form Table 1.

Table 1 is a calibrated relationship table of dQ/dOCV-OCV curves varying with aging degrees of a battery cell corresponding to FIG. 3 according to an embodiment of the present application. Table 1 shows OCVs (3.4V, 3.65V and 3.9V) corresponding to 3 peaks on the dQ/dOCV-OCV curve under a condition of the calibrated value being SOH1;

and OCVs (3.38V, 3.55V, 3.88V) corresponding to 3 peaks on the dQ/dOCV-OCV curve under a condition of the calibrated value being SOH2.

TABLE 1

| | OCV corresponding to Peak P1 | OCV corresponding to Peak P2 | OCV corresponding to Peak P3 |
|---|---|---|---|
| SOH1 | 3.4 V | 3.65 V | 3.9 V |
| SOH2 | 3.38 V | 3.55 V | 3.88 V |

It can be seen from the comparison of the two dQ/dOCV-OCV curves respectively under SOH1 and SOH2 with each other in combination with FIG. 3 and Table 1, when the state of health of the battery cell is transformed from SOH1 to SOH2, the corresponding peaks move due to the characteristics of the material of the battery cell, where P1 moves to P1', P2 moves to P2', and P3 moves to P3', that is, as the battery ages, the OCVs corresponding to the peak points decrease.

Although FIG. 3 and Table 1 show only two sets of peak relationships corresponding to different aging degrees, it can be understood that, in specific implementations, those skilled in the art can specifically calibrate multiple sets of peak relationships corresponding to different aging degrees, and select the number of usable peaks under the aging degree of each set, which will not be limited here.

In specific implementations, those skilled in the art can calibrate OCVs corresponding to dQ/dOCV peaks under various states of health (SOH) respectively, and the state of health of the battery cell can be derived by looking up the table based on the OCVs corresponding to the actual dQ/dOCV peaks of the battery cell.

As described above, according to the embodiments of the present application, for the phenomenon that the OCV relationship curve changes significantly after the battery cells are aged, the change rule of the OCV relationship curve is quantified to generate the pre-calibrated corresponding relationship between peak voltage parameter data and SOH calibration values. Therefore, when the SOH needs to be corrected with the problem of inaccurate SOH estimation caused by the deviation of the OCV-SOC relationship curve after the battery cell is aged, the current SOH can be corrected by obtaining the relationship curve between the ratio of an accumulated charge/discharge capacity variation to a corresponding voltage-parameter variation of a battery cell and a voltage parameter itself; determining the valid peak point on the relationship curve; and correcting the current SOH according to the SOH calibration value. Thus, the accuracy of the estimation of the SOH can be improved.

Figure 4:
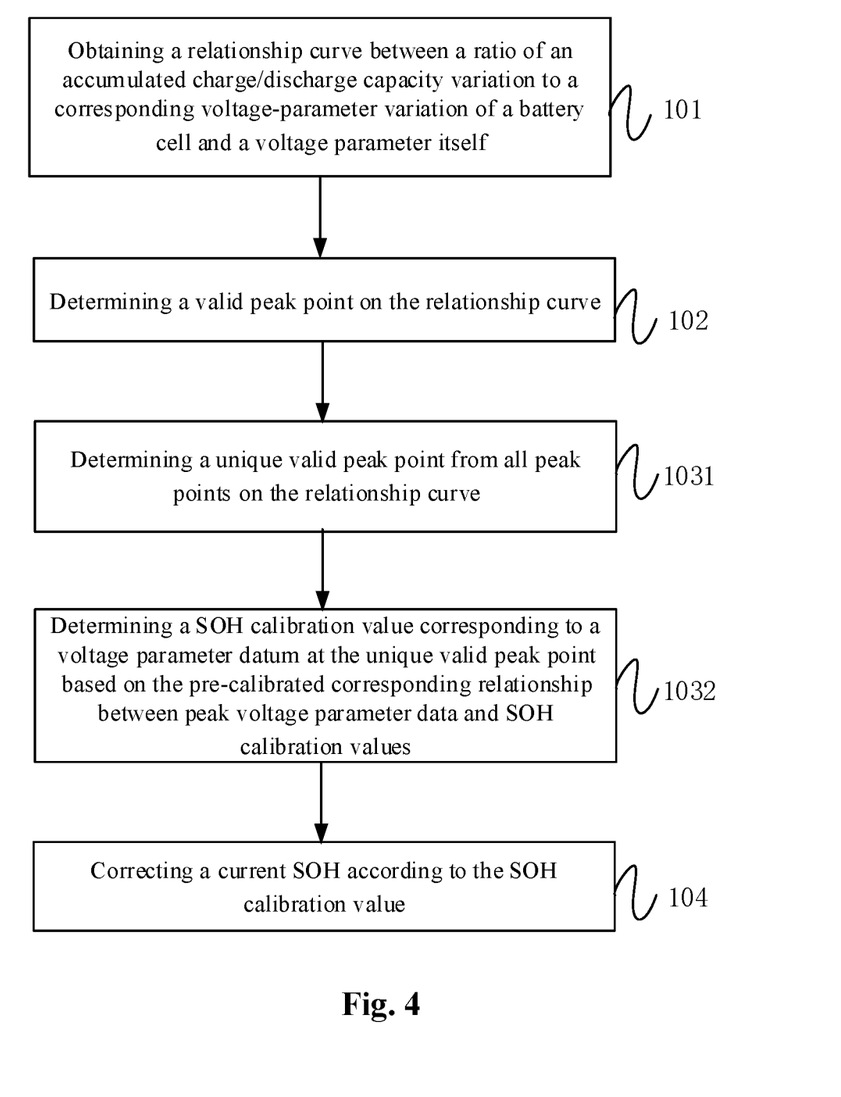
FIG. 4 is a schematic flowchart of a method for correcting a SOH according to a second embodiment of the present application.

FIG. 4 is a schematic flowchart of a method for correcting a SOH according to a second embodiment of the present application. FIG. 4 is different from FIG. 1 by that step 103 in FIG. 1 may specifically include step 1031 and step 1032 in FIG. 4 for describing a first manner for acquiring the SOH calibration value.

At step 1031, a unique valid peak point is determined from all peak points on the relationship curve.

At step 1032, a SOH calibration value corresponding to a voltage parameter datum at the unique valid peak point is determined based on the pre-calibrated corresponding relationship between peak voltage parameter data and SOH calibration values.

That is to say, there is only one peak point used for the calculation of the SOH calibration value, and the SOH calibration value corresponding to the OCV at the unique valid peak point can be determined by looking up Table 1.

Specifically, step 1031 may be performed in two steps: first, peak points that meet a first predetermined condition are selected from the dQ/dOCV-OCV relationship curve, and then the peak point with the maximum corresponding dQ/dOCV among the peak points is determined as the unique valid peak point.

The number of peak points meeting the first predetermined condition may be multiple, for example, the peak points meeting the first predetermined condition may include P1, P2, PN. Assuming that a total of 2 peak points, P1 and P2, are selected, where the voltage parameter and dQ/dOCV corresponding to P1 are 3.6V and 100 respectively, and the voltage parameter and dQ/dOCV corresponding to P2 are 3.55V and 250 respectively, then the point P2 is taken as the unique valid peak point.

The first predetermined condition is: for a peak point, a corresponding ratio of an accumulated charge/discharge capacity variation to a voltage-parameter variation is greater than a seventh threshold, and a corresponding voltage parameter datum is within a preset range of checkable voltage parameters [OCVmin, OCVmax].

The preset range of checkable voltage parameters is determined according to the pre-calibrated corresponding relationship between peak voltage parameter data and SOH calibration values. For example, for the peak that changes most significantly due to the aging of the battery cell in Table 1, the greater one between an OCV corresponding to that peak under a SOH calibration value of 100% and an OCV corresponding to that peak under a SOH calibration value of 70% (or other preset SOH lower limit) is determined as OCVmax, and the smaller one between the above two OCVs is determined as OCVmin.

In combination with Table 1, the OCVs corresponding to the three peaks under SOH1 (100%) are 3.4V, 3.65V, and 3.9V respectively; the OCVs corresponding to the three peaks under SOH2 (70%) are 3.38V, 3.55V, and 3.88V. It can be seen that, the peak of 3.65V (under 100% SOH) changes most significantly due to aging of the battery cell. Therefore, among all the peaks that change due to aging of the battery cell, only the peak corresponding to 3.65V under 100% SOH is selected as the basis for subsequent determination of an aging degree. At this time, the corresponding OCV range of that peak in the entire life cycle of the battery cell is [3.55V, 3.65V].

The above example is only an example manner for determining the preset range of checkable voltage parameters, and those skilled in the art can determine the appropriate range of checkable voltage parameters as needed, which will not be limited here.

Figure 5:
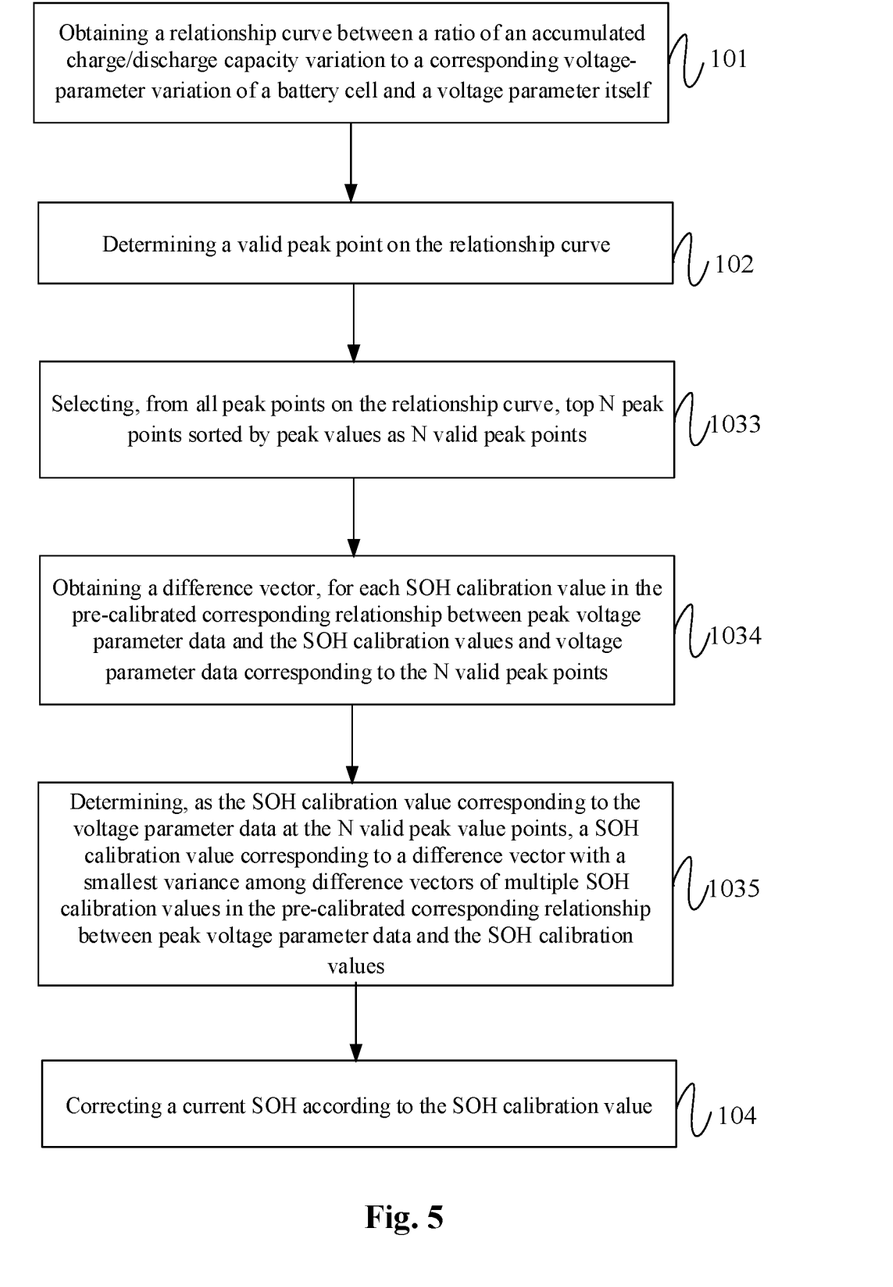
FIG. 5 is a schematic flowchart of a method for correcting a SOH according to a third embodiment of the present application.

FIG. 5 is a schematic flowchart of a method for correcting a SOH according to a third embodiment of the present application. FIG. 5 is different from FIG. 1 by that step 103 in FIG. 1 may specifically include step 1033 and step 1035 in FIG. 5 for describing a second manner for acquiring the SOH calibration value.

At step 1033, top N peak points sorted by peak values are selected from all peak points on the relationship curve as N valid peak points.

At step 1034, a difference vector is obtained for each SOH calibration value in the pre-calibrated corresponding relationship between peak voltage parameter data and the SOH calibration values and voltage parameter data corresponding to the N valid peak points. The difference vector is a difference between a first vector and a second vector, wherein the first vector represents N peak voltage parameter data values corresponding to the each SOH calibration value, and the second vector represents voltage parameter data corresponding to the N valid peak points.

At step 1035, a SOH calibration value corresponding to a difference vector with a smallest variance among difference vectors of multiple SOH calibration values in the pre-calibrated corresponding relationship between peak voltage parameter data and the SOH calibration values is determined as the SOH calibration value corresponding to the voltage parameter data at the N valid peak points.

The schemes in FIG. 5 are illustrated by the following example.

Referring to Table 1, the first vector (OCVp1, OCVp2, OCVp3) is formed by the OCVs corresponding to the three peaks under SOH1. The top three peaks ranked by values in the sorted peak sequence di (di=dQi/dOCVi) are selected offline, and the second vector (OCVk1, OCVk2, OCVk3) is formed by OCVs corresponding to the top three peaks. The difference between the first vector and the second vector is taken as the difference vector, and the variance of the difference vector is denoted as var.

The above process is performed on each and every SOHi in Table 1, so as to obtain a variance sequence vari. The SOH calibration value corresponding to the smallest variance is taken as the most consistent SOHi value, and then the outputted and stored SOH is updated according to the estimated SOHi value.

Between the above two manners for acquiring the SOH calibration value, advantages of the first manner include that only one peak point is selected for the determination, so that the amount of calculation is small; advantages of the second manner include that the determination can be made based on multiple peaks, so that it is more robust against single point errors. In specific implementations, those skilled in the art can choose the manner for acquiring the SOH calibration value as needed, which will not be limited here.

According to the embodiments of the present application, the dQ/dOCV-OCV relationship curve may be determined based on the collected sequence of voltage parameters (such as OCVi or Vi) and the collected sequence of accumulated charge/discharge capacities Capi. The manners for acquiring the various sequences will be described in detail below in combination with different operating conditions.

A first operating condition is a charging and resting operating condition. Under this condition, an accumulated charge/discharge capacity during a charging process of the battery cell is recorded; when a difference between a current accumulated charge capacity and a previous accumulated charge capacity reaches a third threshold, the charging process of the battery cell is controlled to stop or a charging current is decreased to a fourth threshold, and after a first predetermined period of time, the charging process of the battery cell is restored and the sequence of voltage parameters OCVi and the sequence of accumulated charge/discharge capacities Capi are recorded for one time, until the charging process of the battery cell completes or stops.

A second operating condition is a continuous charging condition. Under this operating condition, the charging process of the battery cell is controlled to continue until the charging process of the battery cell completes or stops, and the sequence of voltage parameters OCVi and the sequence of accumulated charge/discharge capacities Capi is recorded for one time every second predetermined time period.

A third operating condition is a vehicle-in operation operating condition or a discharge operating condition. Under this condition, every time the battery cell meets a quasi-SOC checkable state during a discharging process, the sequence of voltage parameters OCVi and the sequence of accumulated charge/discharge capacities Capi are recorded for one time, until a difference between a current accumulated discharge capacity and a previous accumulated discharge capacity is less than a fifth threshold, because when the difference between the current accumulated discharge capacity and the previous accumulated discharge capacity is large, peak information of the calculated dQ/dOCV-OCV will be hidden.

The quasi-SOC checkable state is met when at least one of the following conditions is met, where the following conditions include but not limited to:

a resting duration of a vehicle on which the battery cell is installed reaches a first time length;

a sleeping duration of the vehicle on which the battery cell is installed reaches a second time length;

a duration where the vehicle on which the battery cell is installed is in a state of continuous discharging with a low current reaches a third time length; or a current polarization voltage of the battery cell is 0.

Under this operating condition, the SOH can be estimated during the charging or discharging process of the vehicle, and there is no need to discharge battery cell at a specific rate after it is fully charged or preset a specific charging or discharging operating condition. The methods according to the embodiments of the present application are more practical than the prior art where the discharging rate and temperature of the battery are required to be in specific states, for example, the SOH needs to be calculated from the ratio of the discharge capacity when the battery is discharged to a cut-off voltage at a certain rate after it is fully charged to a nominal capacity.

A fourth operating condition is a slow charging operating condition. Under this operating condition. The slow charging current is relatively small, so there is no need to calculate the OCV or acquire the OCV by controlling the charging current, and the dQ/dVolt-V curve in the charging process may be directly calculated from the charging curve, that is, a Vi sequence.

In an alternative embodiment, the initial SOC value at the start of charging process (SOCcharg0) may exceed the range for table looking-up. Therefore, before the obtaining a relationship curve between a ratio of an accumulated charge/discharge capacity variation to a corresponding voltage-parameter variation of a battery cell and a voltage parameter itself (step 101), the method for correcting the SOH further includes: determining that an initial SOC value at the beginning of a charging process of the battery cell is less than a preset checkable maximum initial SOC value.

In order to facilitate those skilled in the art to understand the method for correcting the SOH according to the embodiments of the present application, the method for correcting the SOH according to the embodiments of the present application will be illustrated in detail below by way of example.

Figure 6:
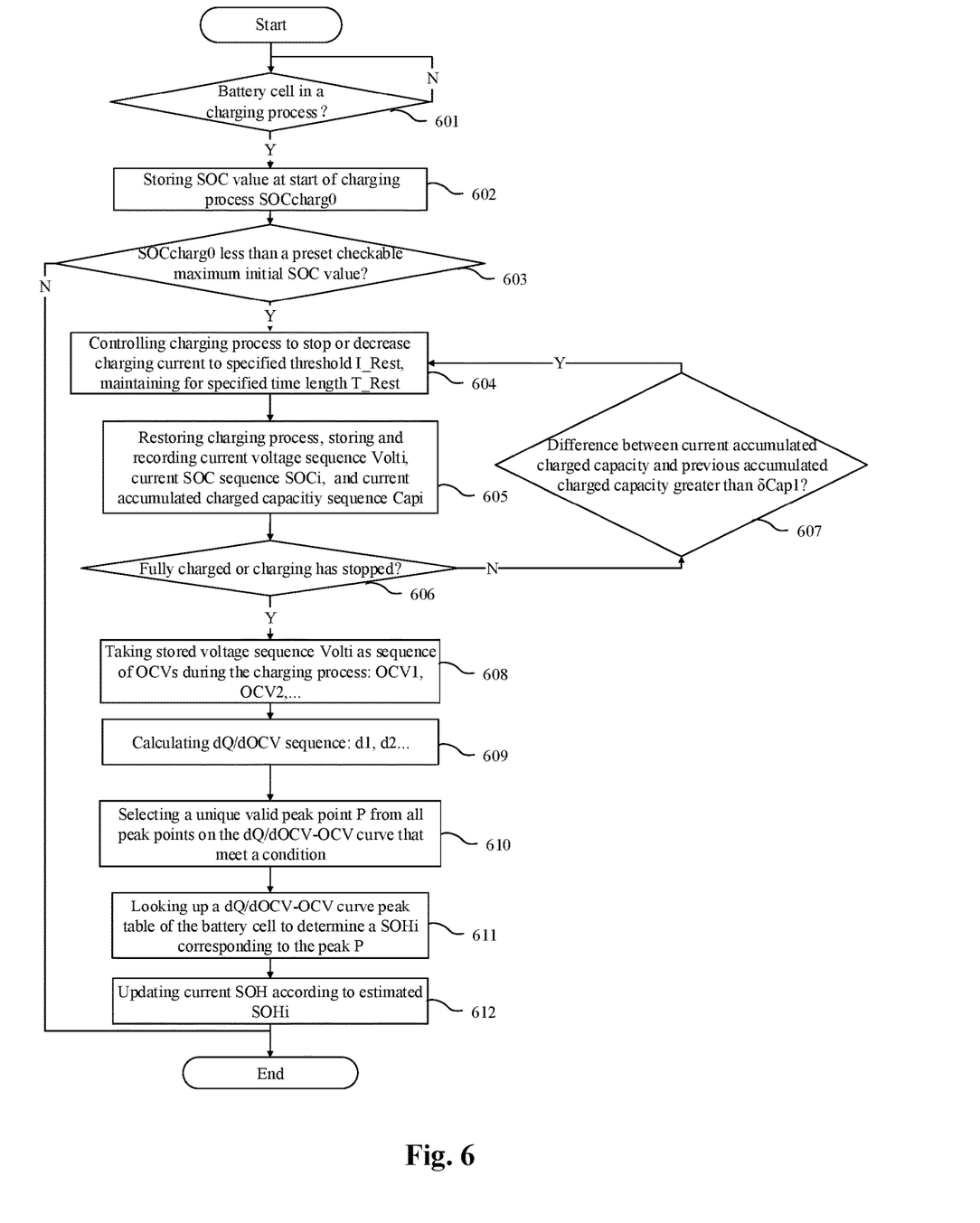
FIG. 6 is a schematic flowchart of a method for correcting a SOH according to a fourth embodiment of the present application.

FIG. 6 is a schematic flowchart of a method for correcting a SOH according to a fourth embodiment of the present application. As shown in FIG. 6, the method for correcting the SOH includes steps 601 to 612.

At step 601, it is determined whether a battery cell is in a charging process (for example, a charging gun is inserted for charging), if so, the method proceeds to step 602; otherwise, the method returns to step 601.

At step 602, a SOC value at the start of the charging process (SOCcharg0) is stored.

At step 603, it is determined whether SOCcharg0 is less than a preset checkable maximum initial SOC value; if so, step 604 is performed; otherwise, the flow ends.

At step 604, the charging process is controlled to stop or a charging current is decreased to a specified threshold I_Rest, and the situation is maintained for a specified time length T_Rest.

At step 605, a sequence of current voltages Volti are stored and recorded, a sequence of current SOCs SOCi are stored and recorded, a sequence of current accumulated charge capacities Capi are stored and recorded, and the charging process is restored.

At step 606, it is determined whether the battery cell is fully charged or the charging has stopped; if the battery cell is not fully charged and the charging has not stopped, the method proceeds to step 607; if the battery cell is fully charged or the charging has stopped, the method proceeds to step 608.

At step 607, it is determined whether the difference between the current accumulated charge capacity and the previous accumulated charge capacity is greater than a threshold δCap1; if so, the method proceeds to step 604 for next round of rest control; if not, the method returns to step 605 to continue charging.

At step 608, the stored sequence of voltages Volti is taken as a sequence of OCVs during the charging process: OCV1, OCV2, . . .

At step 609, a dQ/dOCV sequence, d1, d2, . . . , is calculated.

At step 610, a unique valid peak point P is selected from all peak points on the dQ/dOCV-OCV curve that meet a condition.

At step 11, a dQ/dOCV-OCV curve peak table of the battery cell is looked up to determine a SOHi corresponding to the peak P;

At step 612, a current SOH is updated according to the estimated SOHi.

Figure 7:
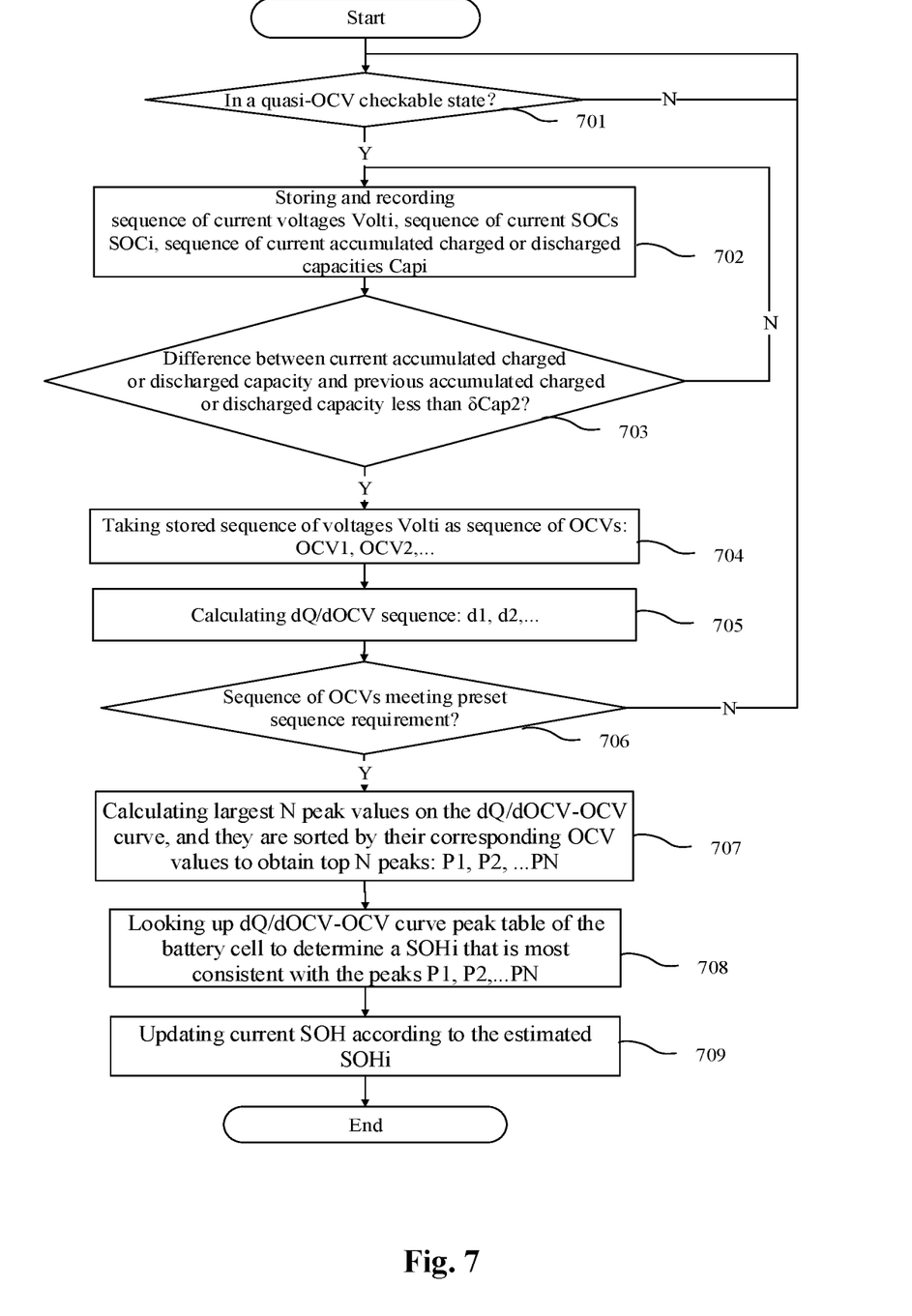
FIG. 7 is a schematic flowchart of a method for correcting a SOH according to a fifth embodiment of the present application.

FIG. 7 is a schematic flowchart of a method for correcting a SOH according to a fifth embodiment of the present application. As shown in FIG. 7, the method for correcting the SOH includes steps 701 to 709.

At step 701, it is determined whether the battery cell is in a quasi-OCV checkable state (for example, in the battery cell is in a discharging process); if so, the method proceeds to step 702; otherwise, the method proceeds to step 701.

At step 702, a sequence of current voltages Volti are stored and recorded, a sequence of current SOCs SOCi are stored and recorded, a sequence of current accumulated charge/discharge capacities Capi are stored and recorded.

At step 703, it is determined whether the difference between the current accumulated charge/discharge capacity and the previous accumulated charge/discharge capacity is less than δCap2; if so, the method proceeds to step 704; otherwise, the method returns to step 702.

Here, the reason why the difference between two adjacent accumulated charge/discharge capacities is required to be less than the threshold δCap2 is that when the difference between two adjacent accumulated charge/discharge capacities is too large, the peak information will be hidden in the calculation of dQ/dOCV.

At step 704, the stored sequence of voltages Volti is taken as a sequence of OCVs: OCV1, OCV2, . . .

At step 705, a dQ/dOCV sequence, d1, d2, . . . , is calculated.

At step 706, it is determined whether the sequence of OCVs meets a preset sequence requirement; if so, the method proceeds to step 707; otherwise, the method proceeds to step 701.

At step 707, the largest N peaks on the dQ/dOCV-OCV curve are calculated, and the largest N peaks are sorted by their corresponding OCV values to obtain top N peaks: P1, P2, . . . PN.

At step 708, a dQ/dOCV-OCV curve peak table of the battery cell is looked up to determine a SOHi that is most consistent with the peaks P1, P2, . . . PN.

At step 709, the current SOH is updated according to the estimated SOHi.

Figure 8:
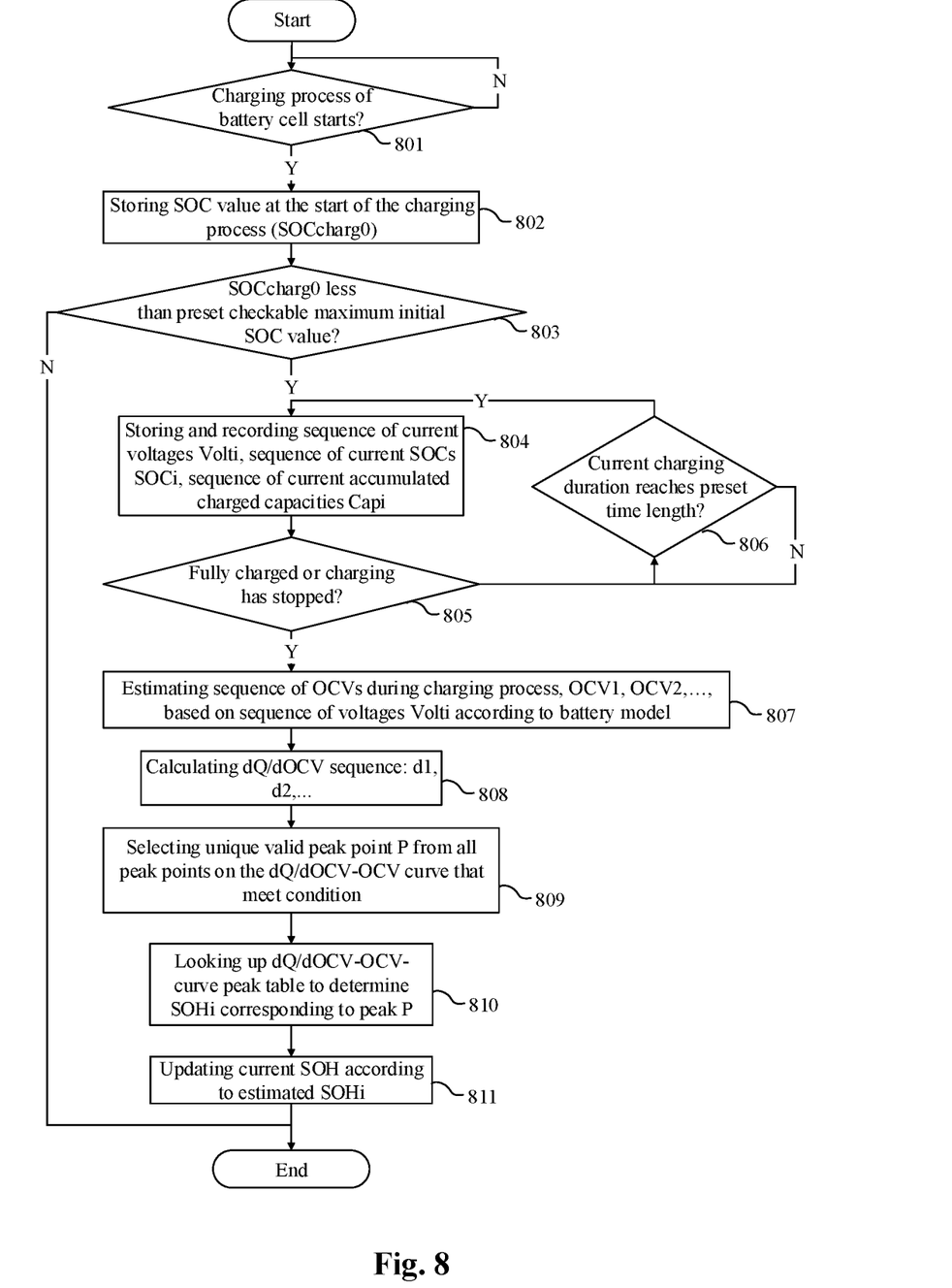
FIG. 8 is a schematic flowchart of a method for correcting a SOH according to a sixth embodiment of the present application.

FIG. 8 is a schematic flowchart of a method for correcting a SOH according to a sixth embodiment of the present application. As shown in FIG. 8, the method for correcting the SOH includes steps 801 to 811.

At step 801, it is determined whether a charging process of the battery cell starts; if so, the method proceeds to step 802, otherwise, the method returns to step 801.

At step 802, a SOC value at the start of the charging process (SOCcharg0) is stored;

At step 803, it is determined whether SOCcharg0 is less than a preset checkable maximum initial SOC value; if so, step 804 is executed; otherwise, the flow ends.

At step 804, a sequence of current voltages Volti are stored and recorded, a sequence of current SOCs SOCi are stored and recorded, a sequence of current accumulated charge capacities Capi are stored and recorded.

At step 805, it is determined whether the battery cell is fully charged or the charging process has stopped; if the battery cell is not fully charged and the charging process has not stopped, the method proceeds to step 806; if the battery cell is fully charged or the charging process has stopped, the method proceeds to step 807.

At step 806, it is determined whether the current charging duration reaches a preset time length; if so, the method returns to step 805; otherwise, the method proceeds to step 806.

At step 807, a sequence of OCVs during the charging process, OCV1, OCV2 . . . , are estimated based on the sequence of voltages Volti according to a battery model.

At step 808, a dQ/dOCV sequence, d1, d2, . . . , is calculated.

At step 809, a unique valid peak point P is selected from all peak points on the dQ/dOCV-OCV curve that meet a condition.

At step 810, a dQ/dOCV-OCV-curve peak table is looked up to determine a SOHi corresponding to the peak P.

At step 811, the current SOH is updated according to the estimated SOHi.

Figure 9:
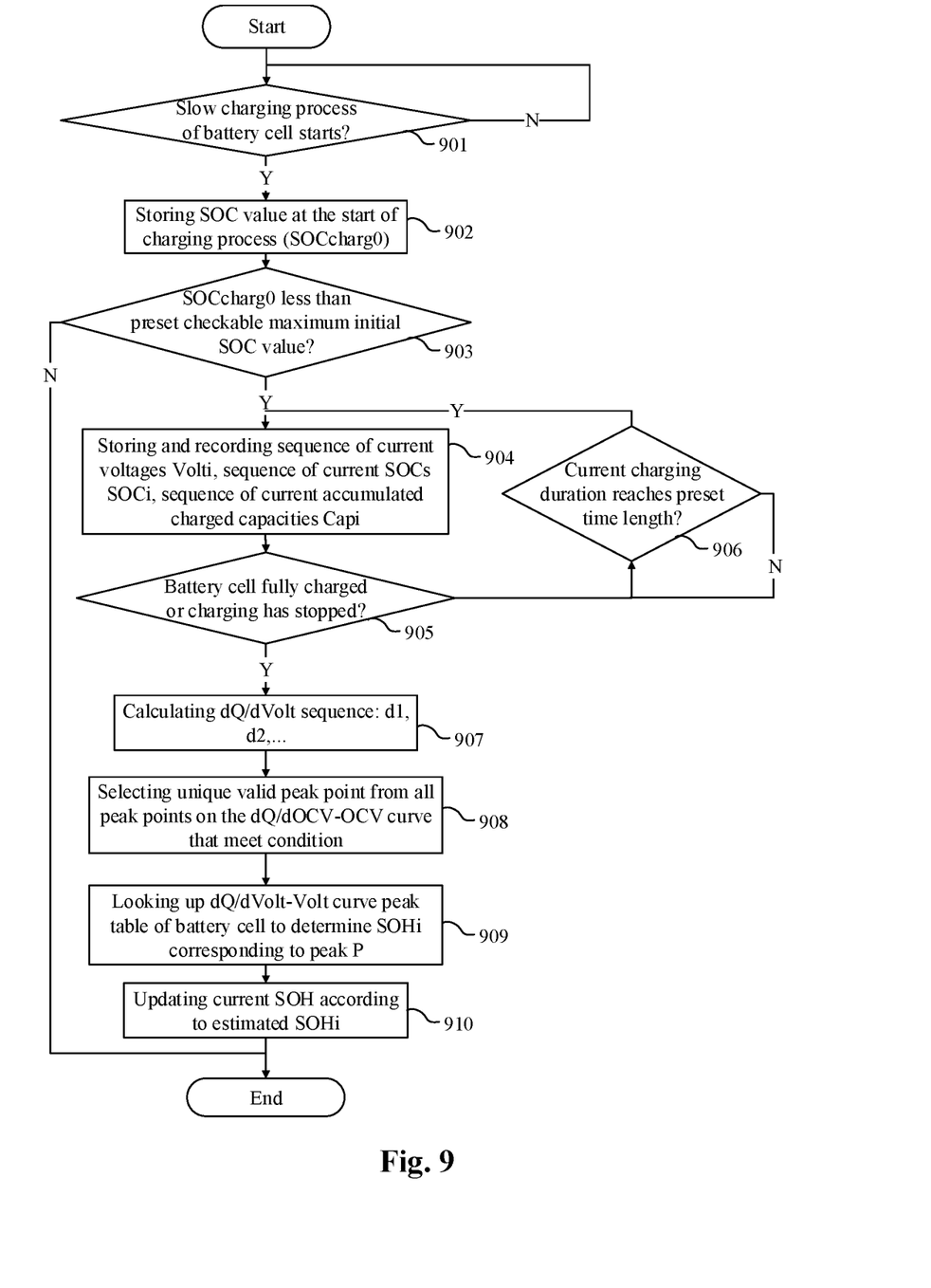
FIG. 9 is a schematic flowchart of a method for correcting a SOH according to a seventh embodiment of the present application.

FIG. 9 is a schematic flowchart of a method for correcting a SOH according to a seventh embodiment of the present application. As shown in FIG. 9, the method for correcting the SOH includes steps 901 to 910.

At step 901, it is determined whether a slow charging process of a battery cell starts; if so, the method proceeds to step 902; otherwise, the method returns to step 901.

At step 902, a SOC value at the start of the charging process (SOCcharg0) is stored;

At step 903, it is determined whether SOCcharg0 is less than a preset checkable maximum initial SOC value; if so, step 904 is performed; otherwise, the flow ends.

At step 904, a sequence of current voltages Volti are stored and recorded, a sequence of current SOCs SOCi are stored and recorded, a sequence of current accumulated charge capacities Capi are stored and recorded.

At step 905, it is determined whether the battery cell is fully charged or the charging has stopped; if the battery cell is not fully charged or the charging has not stopped, the method proceeds to step 906; if the battery cell is fully charged or the charging has stopped, the method proceeds to step 907.

At step 906, it is determined whether the current charging duration reaches a preset time length; if so, the method returns to step 905; otherwise, the method proceeds to step 906.

At step 907, a dQ/dVolt sequence, d1, d2, . . . , is calculated.

At step 908, a unique valid peak point is selected from all peak points on the dQ/dOCV-OCV curve that meet a condition.

At step 909, a dQ/dVolt-Volt curve peak table of the battery cell is looked up to determine a SOHi corresponding to the peak P;

At step 910, the current SOH is updated according to the estimated SOHi.

Figure 10:
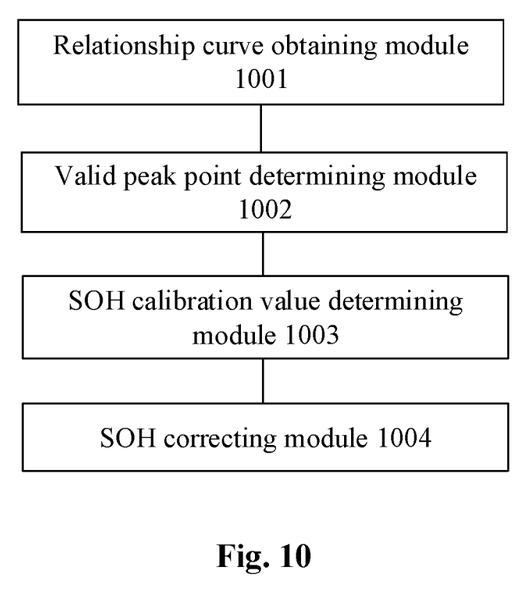
FIG. 10 is a schematic structural diagram of an apparatus for correcting a SOH according to an embodiment of the present application.

FIG. 10 is a schematic structural diagram of an apparatus for correcting a SOH according to an embodiment of the present application. As shown in FIG. 10, the apparatus for correcting the SOH includes: a relationship curve obtaining module 1001, a valid peak point determining module 1002, a SOH calibration value determining module 1003, and a SOH correcting module 1004.

The relationship curve obtaining module 1001 is configured to obtain a relationship curve between a ratio of an accumulated charge/discharge capacity variation to a corresponding voltage-parameter variation of a battery cell and a voltage parameter itself.

The valid peak point determining module 1002 is configured to determine a valid peak point on the relationship curve.

The SOH calibration value determining module 1003 is configured to determine a SOH calibration value corresponding to a voltage parameter datum at the valid peak point based on a pre-calibrated corresponding relationship between peak voltage parameter data and SOH calibration values.

The SOH correcting module 1004 is configured to correct a current SOH based on the SOH calibration value.

An embodiment of the present application also provides a battery management system, which includes the apparatus for correcting the SOH as described above.

An embodiment of the present application also provides a computer-readable storage medium having a program stored thereon, where the program, when executed by a processor, implements the method for correcting the SOH as described above.

Although the present application has been described with reference to the preferred embodiments, various modifications may be made thereto and components thereof may be replaced with equivalents without departing from the scope of the present application. In particular, as long as there is no structural conflict, the technical features mentioned in the embodiments can be combined in any manner. This application is not limited to the specific embodiments disclosed herein, instead, it includes all technical solutions that fall within the scope of the claims.

What is claimed is:

1. A method for correcting a State of Health (SOH) of a battery, comprising:
   collecting a sequence of voltage parameters and a sequence of accumulated charge/discharge capacities;
   obtaining, by a battery management system, a relationship curve between a ratio of an accumulated charge/discharge capacity variation to a corresponding voltage-parameter variation of a battery cell and a voltage parameter, based on the sequence of voltage parameters and the sequence of accumulated charge/discharge capacities;
   determining, by the battery management system, a valid peak point on the relationship curve;
   determining, by the battery management system, a unique valid peak point from all peak points on the relationship curve;
   determining, by the battery management system, a SOH calibration value corresponding to a voltage parameter datum at the unique valid peak point based on a pre-calibrated corresponding relationship between peak voltage parameter data and SOH calibration values; and
   correcting, by the battery management system, a current SOH of the battery according to the SOH calibration value.

2. The method according to claim 1, wherein a number of voltage parameter data in the sequence of voltage parameters is greater than a first threshold; and/or an absolute value of a difference between values of two adjacent voltage parameter data in the sequence of voltage parameters is less than a second threshold.

3. The method according to claim 1,
   further comprising:
   recording, by the battery management system, an accumulated charge/discharge capacity during a charging process of the battery cell; under a condition that a difference between a current accumulated charge capacity and a previous accumulated charge capacity reaches a third threshold, controlling the charging process of the battery cell to stop or decreasing a charging current to a fourth threshold, and after a first predetermined period of time, restoring the charging process of the battery cell and recording the sequence of voltage parameters and the sequence of accumulated charge/discharge capacities for one time, until the charging process of the battery cell completes or stops; or
   controlling, by the battery management system, the charging process of the battery cell to continue until the charging process of the battery cell completes or stops, and recording the sequence of voltage parameters and the sequence of accumulated charge/discharge capacities for one time every second predetermined time period; or
   every time the battery cell meets a quasi-SOC checkable state during a discharging process, recording, by the battery management system, the sequence of voltage parameters and the sequence of accumulated charge/discharge capacities for one time, until a difference between a current accumulated discharge capacity and a previous accumulated discharge capacity is less than a fifth threshold;
   wherein the quasi-SOC checkable state comprises: a resting duration of a vehicle on which the battery cell is installed reaches a first time length; a sleeping duration of the vehicle on which the battery cell is installed reaches a second time length; and a duration where the vehicle on which the battery cell is installed is in a state of continuous discharging with a low current reaches a third time length, or a current polarization voltage of the battery cell is 0.

4. The method according to claim 1, wherein before the obtaining a relationship curve between a ratio of an accumulated charge/discharge capacity variation to a corresponding voltage-parameter variation of a battery cell and a voltage parameter, the method further comprises:
  determining, by the battery management system, that an initial SOC value at the beginning of a charging process of the battery cell is less than a preset checkable maximum initial SOC value.

5. The method of claim 1, wherein
  under a condition that a charging current of the battery cell is greater than or equal to a sixth threshold, the voltage parameter is an open circuit voltage (OCV), and the OCV is determined based on a detected voltage of the battery cell; and
  under a condition that the charging current of the battery cell is lower than the sixth threshold, the voltage parameter is the detected voltage of the battery cell.

6. The method according to claim 1, wherein the determining a unique valid peak point from all peak points on the relationship curve comprises:
  selecting, by the battery management system, from the relationship curve, peak points that meet a first predetermined condition;
  determining, by the battery management system, as the unique valid peak point, a peak point corresponding to a maximum value among accumulated charge/discharge capacity variations of the peak points that meet the first predetermined condition;
  wherein the first predetermined condition is: for a peak point, a corresponding ratio of an accumulated charge/discharge capacity variation to a voltage-parameter variation is greater than a seventh threshold, and a corresponding voltage parameter datum is within a preset range of checkable voltage parameters.

7. The method according to claim 6, wherein the preset range of checkable voltage parameters is determined based on the pre-calibrated corresponding relationship between peak voltage parameter data and SOH calibration values.

8. A non-transitory computer-readable storage medium having a program stored thereon, wherein the program is designed to be executed by a processor and causes the processor to:
  obtain a sequence of voltage parameters and a sequence of accumulated charge/discharge capacities;
  obtain a relationship curve between a ratio of an accumulated charge/discharge capacity variation to a corresponding voltage-parameter variation of a battery cell and a voltage parameter, based on the sequence of voltage parameters and the sequence of accumulated charge/discharge capacities;
  determine a valid peak point on the relationship curve;
  determine a unique valid peak point from all peak points on the relationship curve;
  determine a SOH calibration value corresponding to a voltage parameter datum at the unique valid peak point based on a pre-calibrated corresponding relationship between peak voltage parameter data and SOH calibration values; and
  correct a current SOH according to the SOH calibration value.

9. The non-transitory computer-readable storage medium according to claim 8, wherein a number of voltage parameter data in the sequence of voltage parameters is greater than a first threshold; and/or an absolute value of a difference between values of two adjacent voltage parameter data in the sequence of voltage parameters is less than a second threshold.

10. The non-transitory computer-readable storage medium according to claim 8, wherein
  the program further causes the processor to:
  record an accumulated charge/discharge capacity during a charging process of the battery cell; under a condition that a difference between a current accumulated charge capacity and a previous accumulated charge capacity reaches a third threshold, control the charging process of the battery cell to stop or decrease a charging current to a fourth threshold, and after a first predetermined period of time, restore the charging process of the battery cell and record the sequence of voltage parameters and the sequence of accumulated charge/discharge capacities for one time, until the charging process of the battery cell completes or stops; or
  control the charging process of the battery cell to continue until the charging process of the battery cell completes or stops, and record the sequence of voltage parameters and the sequence of accumulated charge/discharge capacities for one time every second predetermined time period; or
  every time the battery cell meets a quasi-SOC checkable state during a discharging process, record the sequence of voltage parameters and the sequence of accumulated charge/discharge capacities for one time, until a difference between a current accumulated discharge capacity and a previous accumulated discharge capacity is less than a fifth threshold;
  wherein the quasi-SOC checkable state comprises: a resting duration of a vehicle on which the battery cell is installed reaches a first time length; a sleeping duration of the vehicle on which the battery cell is installed reaches a second time length; and a duration where the vehicle on which the battery cell is installed is in a state of continuous discharging with a low current reaches a third time length, or a current polarization voltage of the battery cell is 0.

11. The non-transitory computer-readable storage medium according to claim 8, the program further causes the processor to determine that an initial SOC value at the beginning of a charging process of the battery cell is less than a preset checkable maximum initial SOC value.

12. The non-transitory computer-readable storage medium according to claim 8, wherein
  under a condition that a charging current of the battery cell is greater than or equal to a sixth threshold, the voltage parameter is an open circuit voltage (OCV), and the OCV is determined based on a detected voltage of the battery cell; and
  under a condition that the charging current of the battery cell is lower than the sixth threshold, the voltage parameter is the detected voltage of the battery cell.

13. The non-transitory computer-readable storage medium according to claim 8, the program further causes the processor to:
  select, from the relationship curve, peak points that meet a first predetermined condition;
  determine, as the unique valid peak point, a peak point corresponding to a maximum value among accumulated charge/discharge capacity variations of the peak points that meet the first predetermined condition;
  wherein the first predetermined condition is: for a peak point, a corresponding ratio of an accumulated charge/discharge capacity variation to a voltage-parameter variation is greater than a seventh threshold, and a corresponding voltage parameter datum is within a preset range of checkable voltage parameters.

14. The non-transitory computer-readable storage medium according to claim 13, wherein the preset range of checkable voltage parameters is determined based on the pre-calibrated corresponding relationship between peak voltage parameter data and SOH calibration values.

\* \* \* \* \*